United States Patent
Matsuzawa

Patent Number: 6,000,339
Date of Patent: *Dec. 14, 1999

[54] MATERIAL FOR FORMING SILICA-BASE COATED INSULATION FILM, PROCESS FOR PRODUCING THE MATERIAL, SILICA-BASE INSULATION FILM, SEMICONDUCTOR DEVICE, AND PROCESS FOR PRODUCING THE DEVICE

[75] Inventor: Jun Matsuzawa, Tsukuba, Japan

[73] Assignee: Hitachi Chemical Company, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/765,240
[22] PCT Filed: Jun. 30, 1995
[86] PCT No.: PCT/JP95/01305
§ 371 Date: Dec. 18, 1996
§ 102(e) Date: Dec. 18, 1996
[87] PCT Pub. No.: WO96/00758
PCT Pub. Date: Jan. 11, 1996

[30] Foreign Application Priority Data

Jun. 30, 1994 [JP] Japan .................................. 6-148402
Feb. 27, 1995 [JP] Japan .................................. 7-038179

[51] Int. Cl.$^6$ .............................. C09D 5/25; C09D 183/10
[52] U.S. Cl. ................................ 102/287.14; 106/287.19
[58] Field of Search ..................................... 257/750, 758, 257/759, 760, 632; 428/446, 447; 106/287.14, 287.16

[56] References Cited

U.S. PATENT DOCUMENTS

| | | | |
|---|---|---|---|
| 4,814,017 | 3/1989 | Yoldas et al. .................. | 106/287.16 |
| 4,997,482 | 3/1991 | Haluska et al. .................... | 106/287.14 |
| 5,271,768 | 12/1993 | Morishima et al. ............... | 106/287.16 |
| 5,357,024 | 10/1994 | Leclaire ............................. | 106/287.16 |
| 5,644,014 | 7/1997 | Schmidt et al. .......................... | 528/43 |

FOREIGN PATENT DOCUMENTS

| | | | |
|---|---|---|---|
| 0 327 311 | 8/1989 | European Pat. Off. . | |
| 0 414 001 | 2/1991 | European Pat. Off. . | |
| 0611812A2 | 8/1994 | European Pat. Off. .......... | 106/287.16 |
| 43 38 361 | 5/1995 | Germany . | |
| 63-83175 | 4/1988 | Japan ................ | 106/287.14 |
| 63-135462 | 7/1988 | Japan ................ | 106/287.16 |
| 4-311781 | 11/1992 | Japan . | |
| 05 124818 | 5/1993 | Japan . | |
| 5-124818 | 5/1993 | Japan . | |
| 5-267282 | 10/1993 | Japan . | |
| 5-315319 | 11/1993 | Japan . | |
| 06 293879 | 2/1995 | Japan . | |
| WO 92 21729 | 12/1992 | WIPO . | |

*Primary Examiner*—David Brunsman
*Attorney, Agent, or Firm*—Pennie & Edmonds LLP

[57] ABSTRACT

A material for forming silica-base coated insulation films used to form interlayer insulation films of multi-layer interconnection in VLSIs is provided. A material for forming a silica-base coated insulation film, obtained from (a) an alkoxysilane and/or a partially hydrolyzed product thereof, (b) a fluorine-containing alkoxysilane and/or (e) an alkylalkoxysilane, (c) an alkoxide of a metal other than Si and/or a derivative thereof and (d) an organic solvent. The material for forming silica-base coated insulation films according to the present invention has a storage stability and also enables thick-layer formation. Silica-base insulation films obtained are transparent and uniform films and are those in which no defects such as cracks or pinholes are seen, also having a superior oxygen plasma resistance.

8 Claims, 3 Drawing Sheets

MATERIAL FOR FORMING SILICA-BASE COATED INSULATION FILM, PROCESS FOR PRODUCING THE MATERIAL, SILICA-BASE INSULATION FILM, SEMICONDUCTOR DEVICE, AND PROCESS FOR PRODUCING THE DEVICE

TECHNICAL FIELD

This invention relates to a material for forming silica-base coated insulation films used to form, e.g., interlayer insulation films of multi-layer interconnections (wiring) in super VLSI, and relates to a process for its production and a silica-base insulation film. More particularly, this invention relates to a material for forming silica-base coated insulation films that enables thick-layer formation on various substrates such as semiconductor substrates and glass plates and also has a good oxygen plasma resistance, and relates to a process for its production and a silica-base insulation film.

BACKGROUND ART

In recent years, VLSIs have been rapidly made higher in packaging density and more highly integrated, and there is a demand for more multi-layered aluminum wiring and for decreasing minimum working line width as its wiring patterns are made finer. Accordingly, multi-layer wiring interlayer insulation films used in such LSIs are required to be formed by a smoothing technique which fills wiring gaps without vacancies and also makes their surfaces smooth.

As interlayer insulation films that are required to be made smooth, films (SOG films) formed by what is called the spin-on-glass method (SOG method) are conventionally employed in which a coating solution obtained by hydrolyzing an alkoxysilane and an alkylalkoxysilane in an organic solvent such as alcohol in the presence of water and a catalyst is applied by spin coating, followed by heating to cause coatings to cure. In particular, organic SOG films are mainly used in which the side chain of an organic component (an alkyl group such as methyl) is bonded to the backbone chain of a siloxane bond, i.e., an organic component (an alkyl group such as methyl) is left in the film, which can prevent cracks from occurring and improve smoothing properties to enable thick-layer formation.

The SOG films have advantages such that they cause less volume shrinkage, show a hydrophobicity and have a low dielectric constant. However, when dry etching is carried out using oxygen plasma during the course of the fabrication of an LSI in order to strip a photosensitive resist used to form contact holes that connect aluminum wiring provided at the lower layer and upper layer of the insulation film, this oxygen plasma causes alkyl groups in the film to be released, thus causing cracks. Accordingly, the insulation film is basically formed not in a single layer structure but in a three-layer structure so that the organic SOG film is not laid bare to the surface at the time of oxygen plasma processing, i.e., (i) an SiO$_2$ film serving as a base for SOG film coating is formed by plasma-assisted CVD, (ii) the organic SOG film is formed thereon by coating and etchback-treated and (iii) another SiO$_2$ film serving as an upper coat is formed by plasma-assisted CVD.

FIG. 1 illustrates an example of a process for producing a semiconductor device by the use of such an organic SOG film.

In FIG. 1, reference numeral 11 denotes a semiconductor chip substrate on which circuit electronic components such as a transistor, a diode, a resistor and a capacitor that constitute an electronic circuit are formed; 12, a first aluminum wiring formed on the semiconductor chip substrate; 13, the SiO$_2$ film serving as a base for coating the organic SOG film, formed by plasma-assisted CVD; and 14, the organic SOG film [FIG. 1 (a)]. Etchback treatment is carried out to subject the whole surface of the organic SOG film 14 to oxygen plasma processing to make the plasma CVD SiO$_2$ film laid bare at the part corresponding to the aluminum wiring 12 [FIG. 1 (b)]. Over the entire surface having been subjected to etchback treatment, another SiO$_2$ film 15 serving as an upper coat is formed by plasma-assisted CVD, and a stated etching resist 16 is formed thereon [FIG. 1 (c)]. The plasma CVD SiO$_2$ film at the part corresponding to the aluminum wiring 12, not covered with the etching resist 16, is removed by etching to make the aluminum wiring 12 exposed, and the etching resist is removed [FIG. 1 (d)]. Then, a second aluminum wiring 17 connected with the first aluminum wiring 12 is formed [FIG. 1 (e)]. Thus a semiconductor device is produced.

However, as the VLSIs are made higher in packaging density and more highly integrated, the space between aluminum wirings becomes so fine that the formation of the plasma CVD SiO$_2$ film serving as a base for SOG coating makes the fine space between aluminum wirings still finer in the conventional three-layer structure, and hence an SOG coating solution can be caused to flow into the aluminum wiring space only with difficulty, resulting in a defective state of burying the organic SOG film. For this reason, with a decrease in minimum working line width, which decreases as the aluminum wiring becomes finer, it has become difficult to form the interlayer insulation film in the conventional three-layer structure. Accordingly, it is desirable to provide an SOG film having a good oxygen plasma resistance and enabling formation of the interlayer insulation film even in a single-layer structure.

In order to shorten the semiconductor device fabrication process, aiming at a cost reduction, there is a demand for non-etchback type SOG films that necessitate no etchback treatment. Accordingly, taking as a basis an inorganic SOG film (a film basically containing no organic component) having a good ashing resistance, it has been studied to add fine SiO$_2$ particles, to use B-O and Mg-O bonds in combination or to introduce an Si-N skeleton, but no positive results have been forthcoming.

DISCLOSURE OF THE INVENTION

The present invention provides a material for forming silica-base coated insulation films that enables thick-film coating so as to improve smoothing properties and also has a superior oxygen plasma resistance, and provides a process for its production and a silica-base insulation film.

The first invention of the present application is a material for forming silica-base coated insulation films which is obtained from (a) an alkoxysilane and/or a partially hydrolyzed product thereof, (b) a fluorine-containing alkoxysilane, (c) an alkoxide of a metal other than Si and/or a derivative thereof and (d) an organic solvent; and a process for its production.

The second invention of the present application is a material for forming silica-base coated insulation films which is obtained from (a) an alkoxysilane and/or a partially hydrolyzed product thereof, (e) an alkylalkoxysilane, (c) an alkoxide of a metal other than Si and/or a derivative thereof and (d) an organic solvent; and a process for its production.

The third invention of the present application is a material for forming silica-base coated insulation films which is obtained from (a) an alkoxysilane and/or a partially hydrolyzed product thereof, (b) a fluorine-containing alkoxysilane, (f) water and a catalyst and (d) an organic solvent; and a process for its production.

The fourth invention of the present application is a process for producing a material for forming silica-base coated insulation films which is obtained from (a) an alkoxysilane, (e) an alkylalkoxysilane and/or (b) a fluorine-containing alkoxysilane, (c) an alkoxide of a metal other than Si and/or a derivative thereof, (d) an organic solvent and (f) water and a catalyst; the process comprising mixing the alkylalkoxysilane and/or the fluorine-containing alkoxysilane, the water and the catalyst in an organic solvent, thereafter adding the alkoxide of a metal other than Si and/or the derivative thereof, further mixing the alkoxysilane, and thereafter adding the water and the catalyst.

The fifth invention of the present application is a material for forming silica-base coated insulation films which is obtained from (e) an alkylalkoxysilane and/or (b) a fluorine-containing alkoxysilane, (c) an alkoxide of a metal other than Si and/or a derivative thereof, (d) an organic solvent and (f) water and a catalyst; and a process for its production.

The sixth invention of the present application is a material for forming silica-base coated insulation films which is obtained from (a) an alkoxysilane and a partially hydrolyzed product thereof, (e) an alkylalkoxysilane and/or (b) a fluorine-containing alkoxysilane, (c) an alkoxide of a metal other than Si and/or a derivative thereof, (d) an organic solvent and (g) a photo-acid-generator; and a process for its production.

The first invention of the present application will be described below.

As the component-(a) alkoxysilane, we can enumerate a monomer or an oligomer of tetramethoxysilane, tetraethoxysilane, tetrapropoxysilane, tetrabutoxysilane etc., which may each be used alone or in combination of two or more kinds.

The partially hydrolyzed product of the alkoxysilane can be obtained by allowing a monomer or an oligomer of each alkoxysilane to react in an organic solvent after addition of water and a catalyst such as an organic acid, at a temperature not higher than the boiling point of the organic solvent for a stated time.

As the catalyst, an acid or an alkali may be used as a catalyst for hydrolysis. The acid may include inorganic acids such as hydrochloric acid, nitric acid, sulfuric acid, phosphoric acid, boric acid and carbonic acid, organic acids such as formic acid, acetic acid, propionic acid, butyric acid, lactic acid, malic acid, tartaric acid, citric acid, oxalic acid, malonic acid, succinic acid, glutaric acid, adipic acid, fumaric acid, maleic acid and oleic acid, and acid anhydrides or derivatives of these. The alkali may include sodium hydroxide, potassium hydroxide, lithium hydroxide, ammonia, methylamine, ethylamine and ethanolamine.

The water may be added in an amount ranging from 2 mols to 4 mols per mol of the alkoxysilane. If added in an amount less than 2 mols, the alkoxysilane may be insufficiently hydrolyzed to make it difficult to form coatings at the time of coating. If added in an amount more than 4 mols, the hydrolysis may take place abruptly and tend to cause coating solutions to gel. The catalyst may preferably be added in an amount of from 0.1 part by weight to 5 parts by weight based on 100 parts by weight of the alkoxysilane. If it is added in an amount less than 0.1 part by weight, the alkoxysilane may be insufficiently hydrolyzed to make it difficult to form coatings at the time of coating. If added in an amount more than 5 parts by weight, the hydrolysis may take place abruptly and tend to cause coating solutions to gel. There are no particular limitations on the reaction temperature at the time of hydrolysis. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and preferred.

The component-(b) fluorine-containing alkoxysilane refers to an alkoxysilane, an alkylalkoxysilane to the Si of which a fluorine atom is bonded, an alkylalkoxysilane at least part of alkyl groups of which has been fluorinated, etc. each of which including a fluorine-containing alkylalkoxysilane. Specifically, we can enumerate fluorotrimethoxysilane, fluorotriethoxysilane, trifluoromethyltrimethoxysilane, trifluoromethyltriethoxysilane, trifluoropropyltrimethoxysilane, trifluoropropyltriethoxysilane, tridecafluorooctyltrimethoxysilane, tridecafluorooctyltriethoxysilane, heptadecafluorodecyltrimethoxysilane, heptadecafluorodecyltriethoxysilane, fluoromethyldimethoxysilane, fluoromethyidiethoxysilane, trifluoromethylmethyidimethoxysilane, trifluoromethylmethyidiethoxysilane, trifluoropropylmethyldimethoxysilane, trifluoropropylmethyIdiethoxysilane, tridecafluorooctylmethyldimethoxysilane, tridecafluorooctylmethyldiethoxysilane, heptadecafluorodecylmethyldimethoxysilane, heptadecafluorodecylmethyidiethoxysilane, and so on. These may each be used alone or in combination of two or more kinds. As the component-(c) alkoxide of a metal other than Si, we can enumerate methoxide, ethoxid, propoxide, butoxide and the like of a metal such as Li, Na, Cu, Mg, Ca, Sr, Ba, Zn, B, Al, Ga, In, Y, Ge, Sn, Pb, Ti, Zr, P, Sb, V, Ta, Nb, or W. The derivative thereof are acetylacetonate derivatives of these etc. Any of these may each be used alone or in combination of two or more kinds. In particular, it is preferable to use an alkoxide of Al, Ti or Zr or an acetylacetonate derivative thereof, which is especially readily available as a commercial product, inexpensive and easy to handle.

As the component-(d) organic solvent, we can enumerate monohydric alcohols such as methyl alcohol, ethyl alcohol and isopropyl alcohol, and ethers or esters thereof, polyhydric alcohols such as glycerin and ethylene glycol, and ethers or esters thereof, and ketones such as acetone, methyl ethyl ketone, methyl isobutyl ketone and acetyl acetone. These may each be used alone or in combination of two or more kinds.

The material for forming silica-base coated insulation films which is obtained from these four components (a), (b), (c) and (d) is produced by mixing the alkoxysilane and the fluorine-containing alkoxysilane in the organic solvent, thereafter adding the alkoxide of a metal other than Si and/or the derivative thereof, and making the product have a high molecular weight at room temperature or with heating. Here, in order to more quickly make the product have a high molecular weight, water and an organic acid may be added. The material may also be produced by adding the water and the organic acid to the alkoxysilane in the organic solvent to previously synthesize a partially hydrolyzed product thereof, and mixing in this product the fluorine-containing alkoxysilane, followed by addition of the alkoxide of a metal other than Si and/or the derivative thereof, to proceed with the reaction.

Here, the component (a) and the component (b) may preferably be used in an amount ranging from 1 part by weight to 40 parts by weight in total, based on 100 parts by weight of the organic solvent (d). If the components (a) and (b) are in an amount less than 1 part by weight in total, coatings may be formed only with difficulty at the time of coating. If they are in an amount more than 40 parts by weight, uniform films may be obtained only with difficulty. The component (b) may preferably be added in an amount of from 0.1 mol to 10 mols per mol of the component (a). If the component (b) is added in an amount less than 0.1 mol, cracks tend to occur at the time of heat-curing after coating. If it is added in an amount more than 10 mols, uniform films may be obtained only with difficulty. The component (c) may preferably be added in an amount of from 0.01 mol to 0.5 mol per mol of the total of the components (a) and (b). If the component (c) is added in an amount less than 0.01 mol, the product can be made to have a high molecular weight only with difficulty. If added in an amount more than 0.5 mol, the product may abruptly come to have a high molecular weight, and hence coating solutions tend to gel.

There are no particular limitations on the reaction temperature when the product is made to have a high molecular weight. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The second invention will be described below.

Of the components used in the second invention, (a) the alkoxysilane and/or the partially hydrolyzed product thereof, (c) the alkoxide of a metal other than Si and/or the derivative thereof and (d) the organic solvent are the same as those as described above.

As the component-(e) alkylalkoxysilane we can enumerate methyltrimethoxysilane, methyltriethoxysilane, methyltripropoxysilane, methyltributoxysilane, ethyltrimethoxysilane, ethyltriethoxysilane, ethyltripropoxysilane, ethyltributoxysilane, propyltrimethoxysilane, propyltriethoxysilane, propyltripropoxysilane, propyltributoxysilane, phenyltrimethoxysilane, phenyltriethoxysilane, phenyltripropoxysilane, phenyltributoxysilane, dimethyldimethoxysilane, dimethyldiethoxysilane, dimethyidipropoxysilane, dimethyldibutoxysilane, diethyldimethoxysilane, diethyidiethoxysilane, diethyidipropoxysilane, diethyldibutoxysilane, dipropyldimethoxysilane, dipropyldiethoxysilane, dipropyldipropoxysilane, dipropyldibutoxysilane, diphenyldimethoxysilane, diphenyldiethoxysilane, diphenyidipropoxysilane, diphenyldibutoxysilane, aminopropyltrimethoxysilane, aminopropyltriethoxysilane, aminopropylmethyldimethoxysilane, aminopropyidimethylmethoxysilane, 3-glycidoxypropyltrimethoxysilane, 3-glycidoxypropyltriethoxysilane, 3-glycidoxypropylmethyldimethoxysilane, 3-glycidoxypropyldimethylmethoxysilane, 3-methacryloxypropyltrimethoxysilane, 3-methacryloxypropyltriethoxysilane, 3-methacryloxypropylmethyldimethoxysilane, 3-methacryloxypropyidimethylmethoxysilane, vinyltrimethoxysilane, vinyltriethoxysilane, vinylmethyldimethoxysilane, vinyidimethylmethoxysilane, etc. These may each be used alone or in combination of two or more kinds.

The material for forming silica-base coated insulation films which is obtained from these four components (a), (e), (c) and (d) is produced by mixing the alkoxysilane and the alkylalkoxysilane in the organic solvent, thereafter adding the alkoxide of a metal other than Si and/or the derivative thereof, and making the product have a high molecular weight at room temperature or with heating. Here, in order to more quickly make the product have a high molecular weight, water and/or a catalyst may be added. The material may also be produced by adding the water and the catalyst to the alkoxysilane in the organic solvent to previously synthesize a partially hydrolyzed product thereof, and mixing in this product the alkylalkoxysilane, followed by addition of the alkoxide of a metal other than Si and/or the derivative thereof, to proceed with the reaction.

Here, the component (a) and the component (e) may preferably be used in an amount ranging from 1 part by weight to 40 parts by weight in total, based on 100 parts by weight of the organic solvent (d). If the components (a) and (e) are in an amount less than 1 part by weight in total, coatings may be formed only with difficulty at the time of coating. If they are in an amount more than 40 parts by weight, uniform films may be obtained only with difficulty. The component (e) may preferably be added in an amount of from 0.1 mol to 10 mols per mol of the component (a). If the component (e) is added in an amount less than 0.1 mol, cracks tend to occur at the time of heat-curing after coating. If it is added in an amount more than 10 mols, uniform films may be obtained only with difficulty. The component (c) may preferably be added in an amount ranging from 0.01 mol to 0.5 mol per mol of the total of the components (a) and (e). If the component (c) is added in an amount less than 0.01 mol, the product can be made to have a high molecular weight only with difficulty. If added in an amount more than 0.5 mol, the product may abruptly come to have a high molecular weight, and hence coating solutions tend to gel.

There are no particular limitations on the reaction temperature when the product is made to have a high molecular weight. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The third invention will be described below.

Of the components used in the third invention, (a) the alkoxysilane and/or the partially hydrolyzed product thereof, (b) the fluorine-containing alkoxysilane and (d) the organic solvent are the same as those previously described.

As the component-(f) catalyst, an acid or an alkali may be used. As the acid, we can enumerate inorganic acids such as hydrochloric acid, nitric acid, sulfuric acid, phosphoric acid, boric acid and carbonic acid, organic acids such as formic acid, acetic acid, propionic acid, butyric acid, lactic acid, malic acid, tartaric acid, citric acid, oxalic acid, malonic acid, succinic acid, glutaric acid, adipic acid, fumaric acid, maleic acid and oleic acid, and acid anhydrides or derivatives of these. The alkali may include sodium hydroxide, potassium hydroxide, lithium hydroxide, ammonia, methylamine, ethylamine and ethanolamine.

The material for forming silica-base coated insulation films which is obtained from these four components (a), (b), (f) and (d) is produced by mixing the alkoxysilane and the fluorine-containing alkoxysilane in the organic solvent, thereafter adding the water and the catalyst, and carrying out the reaction at room temperature or with heating. The material may also be produced by adding the water and the catalyst to the alkoxysilane in the organic solvent to previously synthesize a partially hydrolyzed product thereof, and adding to this product the fluorine-containing alkoxysilane, followed by addition of the water and the catalyst, to proceed with the reaction.

Here, the component (a) and the component (b) may preferably be used in an amount ranging from 1 part by weight to 40 parts by weight in total, based on 100 parts by weight of the organic solvent (d). If the components (a) and (b) are in an amount less than 1 part by weight in total, coatings may be formed only with difficulty at the time of coating. If they are in an amount more than 40 parts by weight, uniform films may be obtained only with difficulty. The component (b) may preferably be added in an amount of from 0.1 mol to 10 mols per mol of the component (a). If the component (b) is added in an amount less than 0.1 mol, cracks tend to occur at the time of heat-curing after coating. If it is added in an amount more than 10 mols, uniform films may be obtained only with difficulty. The water of component (f) may preferably be added in an amount ranging from 2 mols to 4 mols per mol of the total of the components (a) and (b). If the water is added in an amount less than 2 mols, the components (a) and (b) may be insufficiently hydrolyzed to make it difficult to form coatings at the time of coating. If added in an amount more than 4 mols, the hydrolysis may abruptly take place to tend to cause coating solutions to gel. The catalyst of component (f) may preferably be added in an amount of from 0.1 part by weight to 5 parts by weight based on 100 parts by weight of the total of the components (a) and (b). If it is added in an amount less than 0.1 part by weight, the components (a) and (b) may be insufficiently hydrolyzed to make it difficult to form coatings at the time of coating. If added in an amount more than 5 parts by weight, the hydrolysis may abruptly take place to tend to cause coating solutions to gel.

There are no particular limitations on the reaction temperature at the time of hydrolysis. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The materials for forming silica-base coated insulation films according to the first, second and third invention as described above are coated on substrates, and the coatings formed are dried to remove the organic solvent, followed by heat-curing at 300° C. or above, so that the silica-base insulation films can be formed. Here, the materials may be coated by a coating method including spin coating, spraying and dip coating, without any particular limitations. There are no particular limitations on drying temperature, which may preferably be in the range of from 100° C. to 300° C. in order to accelerate the evaporation of the organic solvent. The heat-curing may be carried out at a temperature of 300° C. or above without any particular limitations. Its upper limit depends on the type of the substrates used. When, for example, those provided with aluminum wiring as in LSIs are used, the temperature may preferably be 500° C. or below. There are no particular limitations on heat-curing time, and the heating may be completed at the time the physical properties of the films formed after curing have substantially reached equilibrium. There are no particular limitations on how to make judgement on that time. Measurement of the surface hardness of films or thickness of films is simple and is preferred. There are no particular limitations on atmospheres at the time of heat-curing. It is preferable to introduce an inert gas such as nitrogen or argon so that alkyl groups in the component (b) or (e) may be released less during heating.

The fourth invention will be described below.

Of the components used in the fourth invention, (a) the alkoxysilane, (e) the alkylalkoxysilane and/or (b) the fluorine-containing alkoxysilane, (c) the alkoxide of a metal other than Si and/or the derivative thereof, (d) the organic solvent and (f) the water and the catalyst are the same as those previously described.

The water may preferably be added in an amount less than 75% based on 100% of the alkoxyl groups of the respective alkylalkoxysilane and/or fluorine-containing alkoxysilane. If it is added in an amount not less than 75%, the hydrolysis of the alkoxysilane, alkylalkoxysilane, and/or fluorine-containing alkoxysilane may take place abruptly and tend to cause coating solutions to gel or cloud. The catalyst may preferably be added in an amount of from 0.1 part by weight to 5 parts by weight based on 100 parts by weight of the alkoxysilane, alkylalkoxysilane, and/or fluorine-containing alkoxysilane. If it is added in an amount less than 0.1 part by weight, the alkoxysilane, alkylalkoxysilane, and/or fluorine-containing alkoxysilane may be insufficiently hydrolyzed to make it difficult to form coatings at the time of coating. If added in an amount more than 5 parts by weight, the hydrolysis may take place abruptly and tend to cause coating solutions to gel. There are no particular limitations on the reaction temperature at the time of hydrolysis. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The material for forming silica-base coated insulation films which is obtained from (a) the alkoxysilane, (e) the alkylalkoxysilane and/or (b) the fluorine-containing alkoxysilane, (c) the alkoxide of a metal other than Si and/or the derivative thereof, (d) the organic solvent and (f) the water and the catalyst is produced in the following way: First, a stated amount of the alkylalkoxysilane and/or the fluorine-containing alkoxysilane are dispersed in the organic solvent. In the dispersion obtained, the water and the catalyst are mixed, and the mixture is stirred for a while, followed by addition of the alkoxide of a metal other than Si and/or the derivative thereof. The mixture is further stirred for a while to proceed with the reaction, and thereafter the alkoxysilane is added and well mixed, followed by addition of the water and/or the catalyst to cause the product to have a high molecular weight at room temperature or with heating.

Here, the component (a) and the components (e) and/or (b) may preferably be used in an amount ranging from 1 part by weight to 40 parts by weight in total, based on 100 parts by weight of the organic solvent (d). If the components (a) and the components (e) and/or (b) are in an amount less than 1 part by weight in total, coatings may be formed only with difficulty at the time of coating. If they are in an amount more than 40 parts by weight, uniform films may be obtained only with difficulty. The components (e) and/or (b) may preferably be added in an amount of from 0.1 mol to 10 mols per mol of the component (a). If the components (e) and/or (b) is added in an amount less than 0.1 mol, cracks tend to occur at the time of heat-curing after coating. If it is added in an amount more than 10 mols, uniform films may be obtained with difficulty. The component (c) may preferably be added in an amount ranging from 0.01 mol to 1 mol per mol of the total of the components (a) and the components (e) and/or (b). If the component (c) is added in an amount less than 0.01 mol, the product cannot be made to have a sufficiently high molecular weight, and hence coatings may be formed only with difficulty at the time of coating. If added in an amount more than 1 mol, the product may abruptly come to have a high molecular weight, and hence coating solutions tend to gel.

There are no particular limitations on the reaction temperature when the product is made to have a high molecular weight. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The material for forming silica-base coated insulation films, thus produced, is coated on substrates, and the coatings formed are dried to remove the organic solvent, followed by heat-curing at 300° C. or above, so that the silica-base insulation films can be formed. Here, the material may be coated by a coating method including spin coating, spraying and dip coating, without any particular limitations. There are no particular limitations on drying temperature, which may preferably be in the range of from 100° C. to 300° C. in order to accelerate the evaporation of the organic solvent. The heat-curing may be carried out at a temperature of 300° C. or above without any particular limitations. Its upper limit depends on the type of the substrates used. When, for example, those provided with aluminum wiring as in LSIs are used, the temperature may preferably be 500° C. or below. There are no particular limitations on heat-curing time, and the heating may be completed at the time the physical properties of the films formed after curing have substantially reached equilibrium. There are no particular limitations on how to make judgement on that time. Measurement of the surface hardness of films or thickness of films is simple and is preferred. There are no particular limitations on atmospheres at the time of heat-curing. It is preferable to introduce an inert gas such as nitrogen or argon so that alkyl groups in the components (e) and/or (b) may be released less during heating.

The fifth invention will be described below.

Of the components used in the fifth invention, (e) the alkylalkoxysilane and/or (b) the fluorine-containing alkoxysilane, (c) the alkoxide of a metal other than Si and/or the derivative thereof, (d) the organic solvent and (f) the water and the catalyst are the same as those previously described.

The water may preferably be added in an amount less than 75% based on 100% of the alkoxyl groups of the respective alkylalkoxysilane and/or fluorine-containing alkoxysilane. If it is added in an amount not less than 75%, the hydrolysis of the alkylalkoxysilane and/or fluorine-containing alkoxysilane may take place abruptly and tend to cause coating solutions to gel or cloud. The catalyst may preferably be added in an amount of from 0.1 part by weight to 5 parts by weight based on 100 parts by weight of the alkylalkoxysilane and/or fluorine-containing alkoxysilane. If it is added in an amount less than 0.1 part by weight, the alkylalkoxysilane and/or fluorine-containing alkoxysilane may be insufficiently hydrolyzed to make it impossible to form coatings at the time of coating. If added in an amount more than 5 parts by weight, the hydrolysis may take place abruptly and tend to cause coating solutions to gel. There are no particular limitations on the reaction temperature at the time of hydrolysis. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The material for forming silica-base coated insulation films which is obtained from (e) the alkylalkoxysilane and/or (b) the fluorine-containing alkoxysilane, (c) the alkoxide of a metal other than Si and/or the derivative thereof, (d) the organic solvent and (f) the water and the catalyst is produced in the following way: First, a stated amount of the alkylalkoxysilane and/or the fluorine-containing alkoxysilane are dispersed in the organic solvent. In the dispersion obtained, the water and the catalyst are mixed, and the mixture is stirred for a while, followed by addition of the alkoxide of a metal other than Si and/or the derivative thereof to make the product have a high molecular weight at room temperature or with heating.

Here, the components (e) and/or (b) may preferably be used in an amount ranging from 1 part by weight to 40 parts by weight in total, based on 100 parts by weight of the organic solvent (d). If the components (e) and/or (b) are in an amount less than 1 part by weight in total, coatings may be formed only with difficulty at the time of coating. If they are in an amount more than 40 parts by weight, uniform films may be obtained with difficulty. The component (c) may preferably be added in an amount ranging from 0.01 mol to 1 mol per mol of the total of the components (e) and/or (b). If the component (c) is added in an amount less than 0.01 mol, the product cannot be made to have a sufficiently high molecular weight, and hence coatings may be formed only with difficulty at the time of coating. If added in an amount more than 1 mol, the product may abruptly come to have a high molecular weight, and hence coating solutions tend to gel.

There are no particular limitations on the reaction temperature when the product is made to have a high molecular weight. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The material for forming silica-base coated insulation films, thus produced, is coated on substrates, and the coatings formed are dried to remove the organic solvent, followed by heat-curing at 300° C. or above, so that the silica-base insulation films can be formed. Here, the material may be coated by a coating method including spin coating, spraying and dip coating, without any particular limitations. There are no particular limitations on drying temperature, which may preferably be in the range of from 100° C. to 300° C. in order to accelerate the evaporation of the organic solvent. The heat-curing may be carried out at a temperature of 300° C. or above without any particular limitations. However, its upper limit depends on the type of the substrates used. When, for example, those provided with aluminum wiring as in LSIs are used, the temperature may preferably be 500° C. or below. There are no particular limitations on heat-curing time, and the heating may be completed at the time the physical properties of the films formed after curing have substantially reached equilibrium. There are no particular limitations on how to make judgement on that time. Measurement of the surface hardness of films or thickness of films is simple and is preferred. There are no particular limitations on atmospheres at the time of heat-curing. It is preferable to introduce an inert gas such as nitrogen or argon so that alkyl groups in the components (e) and/or (b) may be released less during heating.

The sixth invention of the present application is a material for forming silica-base coated insulation films which is obtained from (a) an alkoxysilane and/or a partially hydrolyzed product thereof, (e) an alkylalkoxysilane and/or (b) a fluorine-containing alkoxysilane, (c) an alkoxide of a metal other than Si and/or a derivative thereof, (d) an organic solvent and (g) a photo-acid-generator; and a process for its production.

Of the components used in the sixth invention, (a) the alkoxysilane and/or the partially hydrolyzed product thereof, (e). the alkylalkoxysilane and/or (b) the fluorine-containing alkoxysilane, (c) the alkoxide of a metal other than Si and/or the derivative thereof and (d) the organic solvent are the same as those previously described.

As the component-(g) photo-acid-generator we can enumerate diphenyliodonium salts such as diphenyliodonium trifluoromethanesulfonate, bis(4-t-butylphenyl)iodonium salts such as bis(4-t-butylphenyl)iodonium hexafluoroantimonate, triphenylsulfonium salts such as triphenylsulfonium trifluomethanesulfonate, triazines such as 2,4,6-tris(trichloromethyl)-1,3,5-triazine, and sulfonates such as benzoin tosylate, etc. These may each be used alone or in combination of two or more kinds.

The material for forming silica-base coated insulation films which is obtained from these components (a), (e) and/or (b), (c), (d), and (g) is produced by mixing the alkoxysilane and the alkylalkoxysilane and/or the fluorine-containing alkoxysilane in the organic solvent, thereafter adding the alkoxide of a metal other than Si and/or the derivative thereof, and causing the product to have a high molecular weight at room temperature or with heating, followed by addition of the photo-acid-generator.

Here, in order to more quickly make the product have a high molecular weight, water and an organic acid may be added. The material may also be produced by adding the water and the organic acid to the alkoxysilane in the organic solvent to previously synthesize a partially hydrolyzed product thereof, and mixing in this product the alkylalkoxysilane and/or the fluorine-containing alkoxysilane, followed by addition of the alkoxide of a metal other than Si and/or the derivative thereof.

Here, the component (a) and the components (e) and/or (b) may preferably be used in an amount ranging from 1 part by weight to 40 parts by weight in total, based on 100 parts by weight of the organic solvent (d). If the components (a) and the components (e) and/or (b) are in an amount less than 1 part by weight in total, coatings may be formed only with difficulty at the time of coating. If they are in an amount more than 40 parts by weight, uniform films may be obtained only with difficulty. The components (e) and/or (b) may preferably be added in an amount of from 0.1 mol to 10 mols per mol of the component (a). If the components (e) and/or (b) is added in an amount less than 0.1 mol, cracks tend to occur at the time of heat-curing after coating. If it is added in an amount more than 10 mols, uniform films may be obtained only with difficulty. The component (c) may preferably be added in an amount ranging from 0.01 mol to 0.5 mol per mol of the total of the components (a) and the components (e) and/or (b). If the component (c) is added in an amount less than 0.01 mol, the product cannot be made to have a sufficiently high molecular weight, and hence coatings may be formed only with difficulty at the time of coating. If added in an amount more than 0.5 mol, the product may abruptly come to have a high molecular weight, and hence coating solutions tend to gel. The component (g) may preferably be added in an amount not less than 0.1 mol % based on the total weight of the components (a) and the components (e) and/or (b). If the component (g) is added in an amount less than 0.1 mol %, it may generate acid in a small amount at the time of exposure to light, resulting in an insufficient pattern formation.

There are no particular limitations on the reaction temperature when the product is made to have a high molecular weight. The temperature may preferably be not higher than the boiling point of the organic solvent used, and may particularly preferably be 5° C. to 70° C. in order to control the molecular weight of the resultant hydrolyzed product. There are no particular limitations on the reaction time at the time of hydrolysis, and the reaction may be completed at the time the product reaches a stated molecular weight. There are no particular limitations on how to measure the molecular weight here. A method employing liquid chromatography is simple and is preferred.

The material for forming silica-base coated insulation films, thus produced, is coated on substrates, and the coatings formed are dried to remove the organic solvent, followed by exposure to light and thereafter heat-curing, and the heat-cured product obtained is developed, so that patterned silica-base thin films can be formed. Here, the material may be coated by a coating method including spin coating, spraying and dip coating, without any particular limitations. There are no particular limitations on drying temperature, which may preferably be in the range of 40° C. or above in order to accelerate the evaporation of the organic solvent. The coatings formed may be exposed to light by a method such as contact exposure, proximity exposure, projection exposure or reduction projection exposure, without any particular limitations. The heat-curing after the exposure may be carried out at a temperature of 80° C. or above without any particular limitations. Its upper limit depends on the type of the substrates used. When, for example, plastic substrates made of polycarbonate etc. are used, the temperature may preferably be 100° C. or below. There are no particular limitations on heat-curing time, and the heating may be completed at the time the physical properties of the films formed after curing have substantially reached equilibrium. There are no particular limitations on how to make judgement on that time. Measurement of the surface hardness of films or thickness of films is simple and is preferred. There are no particular limitations on atmospheres at the time of heat-curing. It is preferable to introduce an inert gas such as nitrogen or argon so that alkyl groups in the components (e) and/or (b) may be released less during heating. As a method for the development, it may include the alkali development, which makes use of an aqueous ammonium hydroxide type solution, the solvent development, which makes use of organic solvents such as alcohols and ketones, without any particular limitations, which are those used in conventional resist materials. In order to enhance the hardness of thin films obtained, the films may be heated again after the development.

FIG. 2 illustrates an example of a process for producing a semiconductor device by the use of the material for forming silica-base coated insulation films according to the present invention.

In FIG. 2, reference numeral 21 denotes a semiconductor chip substrate on which circuit electronic components such as a transistor, a diode, a resistor and a capacitor that constitute an electronic circuit are formed; 22, a first wiring such as a first aluminum wiring formed on the semiconductor chip substrate; an $SiO_2$ film formed by plasma-assisted CVD; and 24, an insulation film formed using the material for forming silica-base coated insulation films according to the present invention [FIG. 2 (a)]. Over the entire surface of the insulation film 24 of the present invention, another $SiO_2$ film 25 is formed by plasma-assisted CVD, and a stated etching resist 26 is formed thereon [FIG. 2 (b)]. Etching treatment is made by dry etching using oxygen plasma etc. to remove the insulation film 24 at the part not covered with the etching resist 26, to thereby expose the first wiring 22 uncovered, and the etching resist is removed [FIG. 2 (c)]. Then, a second wiring 27 such as a second aluminum wiring connected with the first wiring 22 is formed [FIG. 2 (d)]. Thus a semiconductor device is produced.

The $SiO_2$ film 25 formed by plasma-assisted CVD over the entire surface of the insulation film 24 of the present invention may be omitted.

The $SiO_2$ film 23 formed by plasma-assisted CVD on the surfaces of the semiconductor chip substrate 21 and first wiring 22 may also be omitted.

BEST MODES FOR WORKING THE INVENTION

EXAMPLE 1

Figure 1A:
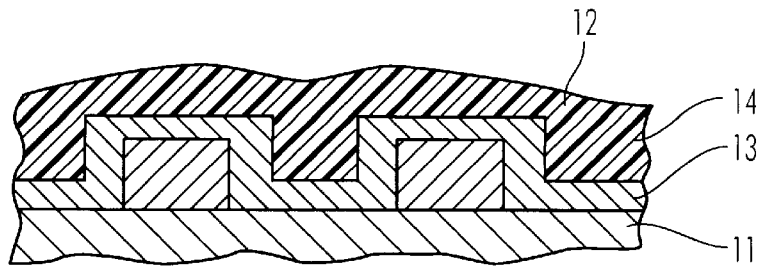
FIG. 1 illustrates, in cross-section, a process for producing a semiconductor device by the use of a conventional organic SOG film.
Figure 1B:
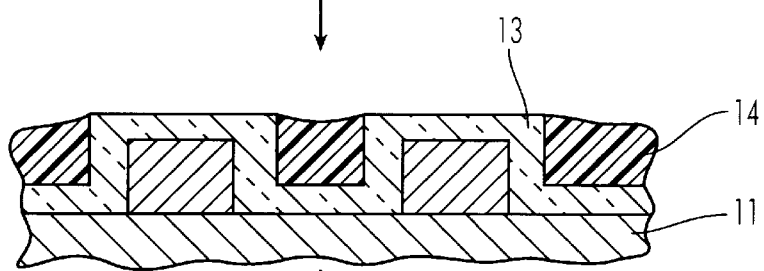
Figure 1C:
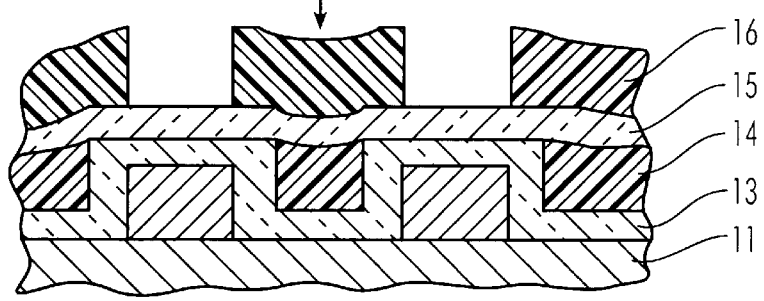
Figure 1D:
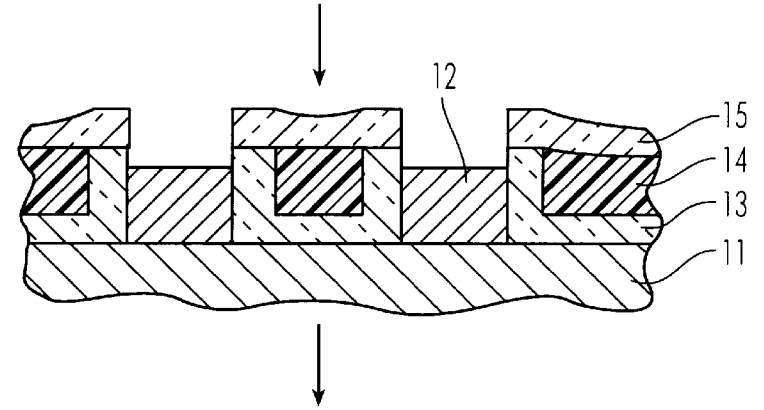
Figure 1E:
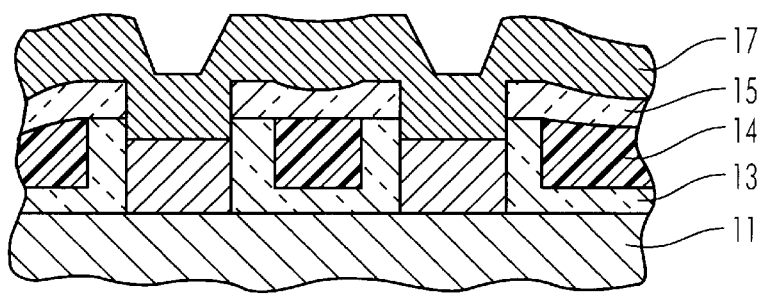
Figure 2A:
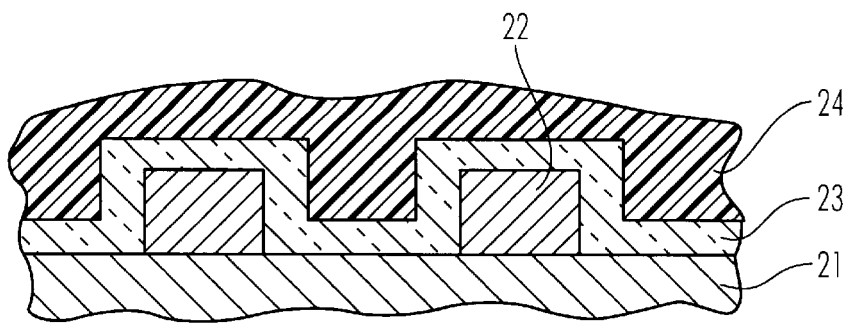
FIG. 2 illustrates, in cross-section, a process for producing a semiconductor device by the use of the insulation film of the present invention.
Figure 2B:
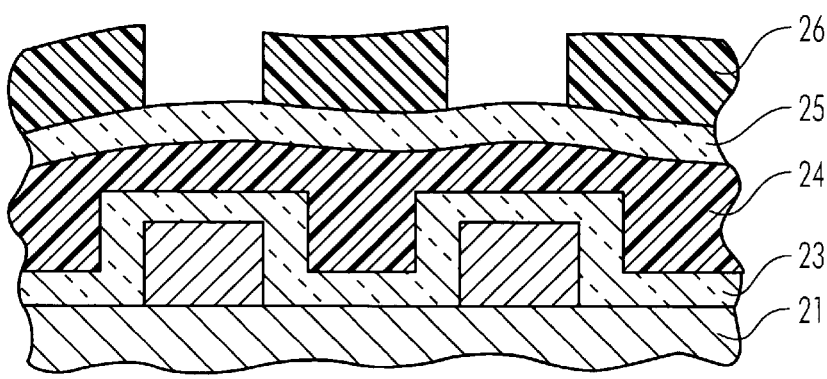
Figure 2C:
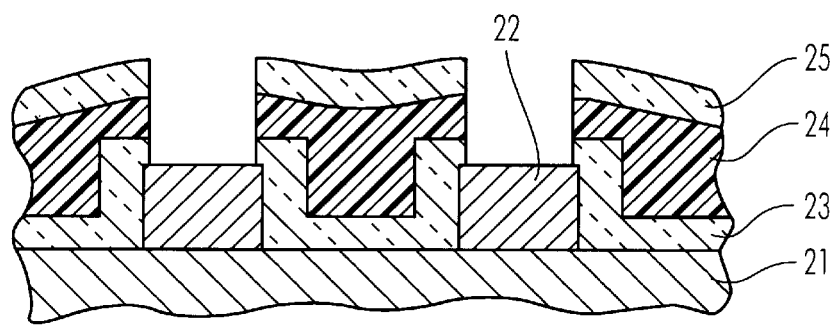
Figure 2D:
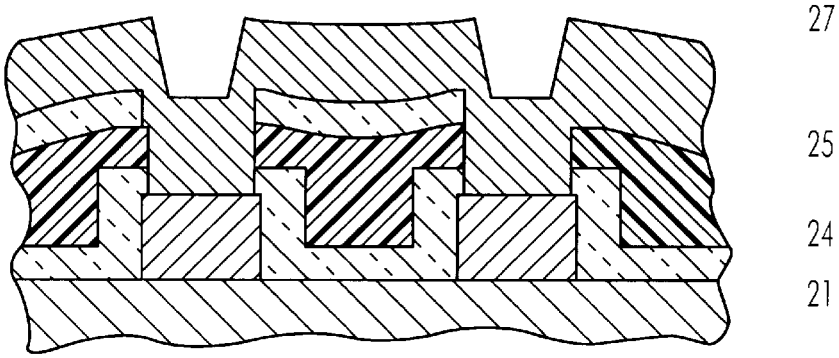

In 345 g (7.5 mols) of ethyl alcohol, 152 g (1 mol) of tetramethoxysilane and 54.5 g (0.25 mol) of trifluoropropyltrimethoxysilane were added. These were well mixed, and thereafter a solution prepared by dissolving 42.5 g (0.125 mol) of tetrabutoxytitanium in 230 g (5 mols) of ethyl alcohol was added while continuing to stir the mixture. While further continuing to stir the mixture, the reaction was allowed to proceed for 24 hours to produce a material for forming silica-base coated insulation films. With respect to this insulation film forming material, its molecular weight distribution was measured using tetrahydrofuran as an eluting solution and using an HPLC (high-speed liquid chromatography) apparatus (Model 6000, manufactured by Hitachi Ltd.). From the results of measurement, number average molecular weight in terms of polystyrene was calculated (columns used: available from Hitachi Chemical Co., Ltd.; trade name: GELPACK GL-R420; flow rate: 1.75 ml/min.). As a result, it was fond to be about 2,640. This insulation film forming material did not gel at all even after being left to stand at room temperature for a month.

Using 1.5 ml of this material for forming silica-base coated insulation films, a silicon wafer having been mirror-polished on one side was coated with this material on its surface by means of a spin coater at 1,500 rpm for 20 seconds, followed by drying for 10 minutes with a 150° C. dryer to remove the solvent. Subsequently, using a tubular baking furnace and in an atmosphere of nitrogen, the coating formed was heated at 400° C. for 30 minutes to cure, to thereby obtain a transparent and uniform silica-base insulation film. Using an automatic elipsometer (manufactured by Mizoshiri Kogaku Kogyosho), the thickness of this insulation film was measured to find that it was 537 nm. Also, using an optical microscope, the surface of this insulation film was observed, where none of defects such as cracks and pinholes were seen.

This silica-base insulation film was subjected to oxygen plasma treatment using a barrel type isotropic plasma etching apparatus and under conditions of oxygen:1 Torr, output: 400 W, time: 20 minutes. Thereafter, the thickness of the film thus treated was measured to reveal that it was 521 nm, and it was seen that its layer thickness became smaller by only about 3% even when exposed to oxygen plasma. Also, using an optical microscope, the surface of this insulation film was observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

EXAMPLE 2

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and temperature was raised to 60° C. While maintaining the temperature at 60° C., the mixture was heated for 1 hour, and thereafter cooled to room temperature, followed by addition of 54.5 g (0.25 mol) of trifluoropropyltrimethoxysilane. The mixture obtained was well mixed, and thereafter a solution prepared by dissolving 42.5 g (0.125 mol) of tetrabutoxytitanium in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 2,910. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 597 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 573 nm, and it was seen that the layer thickness became smaller by only about 4% even when exposed to oxygen plasma.

Using the optical microscope, the surface of this insulation film was also observed, and no defects such as cracks or pinholes were seen. An IR spectrum of this insulation film was also measured. As a result, an absorption peak ascribable to the alkyl group (trifluoropropyl group) was also seen after the oxygen plasma treatment; and the film was found to have a good oxygen plasma resistance.

EXAMPLE 3

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and temperature was raised to 60° C. While maintaining the temperature at 60° C, the mixture was heated for 1 hour, and thereafter cooled to room temperature, followed by addition of 109 g (0.5 mol) of trifluoropropyltrimethoxysilane. The mixture obtained was well mixed, and then a solution prepared by dissolving 45.5 g (0.125 mol) of titanium dipropoxybisacetylacetonate in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was about 1,650. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 749 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 704 nm, and it was seen that the layer thickness became smaller by only about 6% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was seen also after the oxygen plasma treatment, and the film was found to have a good oxygen plasma resistance.

EXAMPLE 4

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and temperature was raised to 60° C. While maintaining the temperature at 60° C., the mixture was heated for 1 hour, and thereafter cooled to room temperature, followed by addition of 109 g (0.5 mol) of trifluoropropyltrimethoxysilane. The mixture obtained was well mixed, and then a solution prepared by dissolving 54.4 g (0.125 mol) of zirconium dibutoxybisacetylacetonato in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 2,300. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 654 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 608 nm, and it was seen that the layer thickness became smaller by only about 7% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

EXAMPLE 5

In 345 g (7.5 mols) of ethyl alcohol, 152 g (1 mol) of tetramethoxysilane and 136 g (1 mol) of methyltrimethoxysilane were added. These were well mixed, and thereafter a solution prepared by dissolving 42.5 g (0.125 mol) of tetrabutoxytitanium in 230 g (5 mols) of ethyl alcohol was added while continuing to stir the mixture. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was about 3,260. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 622 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 585 nm, and it was seen that the layer thickness became smaller by only about 6% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 6

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then a solution prepared by dissolving 42.5 g (0.125 mol) of tetrabutoxytitanium in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 3,190. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 639 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 594 nm, and it was seen that the layer thickness became smaller by only about 7% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was seen also after the oxygen plasma treatment, and the film was found to have a good oxygen plasma resistance.

EXAMPLE 7

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then a solution prepared by dissolving 45.5 g (0.125 mol) of titanium dipropoxy-bisacetylacetonate in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 1,180. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 570 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 532 nm, and it was seen that the layer thickness became smaller by only about 7% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 8

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then a solution prepared by dissolving 54.4 g (0.125 mol) of zirconium dibutoxy-bisacetylacetonate in 230 g (5 mols) of ethyl alcohol was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 1,390. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 514 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 478 nm, and it was seen that the layer thickness became smaller by only about 7% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 9

In 575 g (12.5 mols) of ethyl alcohol, 152 g (1 mol) of tetramethoxysilane and 54.5 g (0.25 mol) of trifluoropropyltrimethoxysilane were added. These were well mixed, and thereafter an aqueous solution prepared by dissolving 3.06 g (0.031 mol) of maleic anhydride in 85.5 g (4.75 mols) of distilled water was added while continuing to stir the mixture. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 1,040. This material did not gel at all even after being left to stand at room temperature for a month.

Using 1.5 ml of this material for forming silica-base coated Insulation films, a transparent and uniform silica-base insulation film was formed in the same manner as in Example 1 on a silicon wafer having been mirror-polished on one side. This insulation film had a layer thickness of 537 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 516 nm, and it was seen that the layer thickness became smaller by only about 4% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

EXAMPLE 10

In 575 g (12.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 54.5 g (0.25 mol) of trifluoropropyltrimethoxysilane. The mixture obtained was well mixed, and then an aqueous solution prepared by dissolving 0.59 g (0.006 mol) of maleic anhydride in 13.5 g (0.75 mol) of distilled water was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 1,880. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 538 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 511 nm, and it was seen that the layer thickness became smaller by only about 5% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

COMPARATIVE EXAMPLE 1

In 575 g (12.5 mols) of ethyl alcohol, 152 g (1 mol) of tetramethoxysilane and 136 g (1 mol) of methyltrimethoxysilane were added. These were well mixed, and thereafter an aqueous solution prepared by dissolving 4.9 g (0.05 mol) of maleic anhydride in 126 g (7 mols) of distilled water was added while continuing to stir the mixture. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 780. This material did not gel at all even after left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 489 nm. Also, using an optical microscope, the surface of this insulation film was observed, and no defects such as cracks or pinholes were seen. This silica-base insulation film was subjected to oxygen plasma treatment in the same manner as in Example 1. As a result, its layer thickness was read to be 391 nm, and it was seen that the layer thickness became smaller by as much as about 20% when exposed to oxygen plasma. Using the optical microscope, the surface of this insulation film was also observed, and a great number of cracks were seen to have occurred over the whole surface.

An IR spectrum of this insulation film was also measured. As a result, any absorption peak ascribable to the alkyl group (methyl group) which had been seen after the baking at 400°

C. was not seen at all after the oxygen plasma treatment, and the alkyl group was found to be released because of oxygen plasma.

COMPARATIVE EXAMPLE 2

In 575 g (12.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then an aqueous solution prepared by dissolving 2.45 g (0.025 mol) of maleic anhydride in 54 g (3 mols) of distilled water was added. While further continuing to stir the mixture, the reaction was allowed to proceed for 24 hours to produce a material for forming silica-base coated insulation films. With respect to this insulation film forming material, its number average molecular weight was calculated in the same manner as in Example 1. As a result, it was found to be about 980. This insulation film forming material did not gel at all even after being left to stand at room temperature for a month.

Using 1.5 ml of this material for forming silica-base coated insulation films, a transparent and uniform silica-base insulation film was formed in the same manner as in Example 1 on a silicon wafer having been mirror-polished on one side. This insulation film had a layer thickness of 489 nm. Also, using an optical microscope, the surface of this insulation film was observed, and no defects such as cracks or pinholes were seen.

This silica-base insulation film was subjected to oxygen plasma treatment in the same manner as in Example 1. As a result, its layer thickness was read to be 395 nm, and it was seen that the layer thickness became smaller by as much as about 20% when exposed to oxygen plasma. Using the optical microscope, the surface of this insulation film was also observed, and a great number of cracks were seen to have occurred over the whole surface.

An IR spectrum of this insulation film was also measured. As a result, any absorption peak ascribable to the alkyl group (methyl group) which had been seen after the baking at 400° C. was not seen at all after the oxygen plasma treatment, and the alkyl group was found to be released because of oxygen plasma.

EXAMPLE 11

In 460.0 g (10 mols) of ethyl alcohol, 136.0 g (1 mol) of methyltrimethoxysilane was added. These were well mixed, and thereafter an aqueous solution prepared by dissolving 1.6 g (0.025 mol) of nitric acid in 27.0 g (1.5 mols) of distilled water was added while continuing to stir the mixture, and the reaction was allowed to proceed at room temperature for 2 hours as it was. A solution prepared by dissolving 170.0 g (0.5 mol) of tetrabutoxytitanium in 460.0 g (10 mols) of ethyl alcohol was further added thereto, and the mixture obtained was stirred for 2 hours. Thereafter, 304.0 g (2 mols) of tetramethoxysilane and 460.0 g (10 mols) of ethanol were added thereto. These were well mixed, and thereafter an aqueous solution prepared by dispersing 3.2 g (0.05 mol) of nitric acid in 72.0 g (4 mols) of distilled water was added. While continuing to stir the mixture, the reaction was allowed to proceed for 24 hours to produce a material for forming silica-base coated insulation films.

With respect to this insulation film forming material, its molecular weight distribution was measured using tetrahydrofuran as an eluting solution and using an HPLC (high-speed liquid chromatography) apparatus (Model 6000, manufactured by Hitachi Ltd.). From the results of measurement, number average molecular weight in terms of polystyrene was calculated (columns used: available from Hitachi Chemical Co., Ltd.; trade name: GELPACK GL-R420; flow rate: 1.75 ml/min.). As a result, it was about 2,140. This insulation film forming material did not gel at all even after being left to stand at room temperature for a month.

Using 1.5 ml of this material for forming silica-base coated insulation films, a silicon wafer having been mirror-polished on one side was coated with this material on its surface by means of a spin coater at 2,000 rpm for 20 seconds, followed by drying for 30 seconds on a 150° C. hot plate and for 30 seconds on a 250° C. hot plate to remove the solvent. Subsequently, using a tubular baking furnace and in an atmosphere of nitrogen, the coating formed was heated at 430° C. for 30 minutes to cure, to thereby obtain a transparent and uniform silica-base insulation film. Using an optical interference layer thickness meter (trade name: LAMBDA ACE; manufactured by Dainippon Screen Mfg. Co., Ltd.), the thickness of this insulation film was measured, and it was found to be 279 nm. Also, using an optical microscope, the surface of this insulation film was observed, and no defects such as cracks or pinholes were seen.

This silica-base insulation film was subjected to oxygen plasma treatment using a barrel type isotropic plasma etching apparatus and under conditions of oxygen:1 Torr, output: 400 W, time: 20 minutes. Thereafter, the thickness of the film thus treated was measured to reveal that it was 272 nm, and it was seen that its layer thickness became smaller by only about 2% even when exposed to oxygen plasma. Also, using the optical microscope, the surface of this insulation film was observed, and no defects such as cracks or pinholes were seen. An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 12

In 460.0 g (10 mols) of ethyl alcohol, 136.0 g (1 mol) of methyltrimethoxysilane was added. These were well mixed, and thereafter an aqueous solution prepared by dissolving 1.6 g (0.025 mol) of nitric acid in 27.0 g (1.5 mols) of distilled water was added while continuing to stir the mixture, and the reaction was allowed to proceed at room temperature for 2 hours as it was. A solution prepared by dissolving 182.0 g (0.5 mol) of titanium dipropoxybisacetylacetonate in 460.0 g (10 mols) of ethyl alcohol was further added thereto, and the mixture obtained was stirred for 2 hours. Thereafter, 304.0 g (2 mols) of tetramethoxysilane and 460.0 g (10 mols) of ethanol were added thereto. These were well mixed, and then an aqueous solution prepared by dissolving 3.2 g (0.05 mol) of nitric acid in 72.0 g (4 mols) of distilled water was added. While continuing to stir the mixture, the reaction was allowed to proceed for 24 hours to produce a material for forming silica-base coated insulation films. The number average molecular weight of this insulation film forming material was calculated in the same manner as in Example 11. As a result, it was found to be about 1,430. This insulation film forming material did not gel at all even after being left to stand at room temperature for a month.

Using 1.5 ml of this material for forming silica-base coated insulation films, a transparent and uniform silica-base insulation film was formed in the same manner as in Example 11 on a silicon wafer having been mirror-polished on one side. This insulation film had a layer thickness of 246 nm. Also, using an optical microscope, the surface of this insulation film was observed, and no defects such as cracks or pinholes were seen.

This silica-base insulation film was subjected to oxygen plasma treatment in the same manner as in Example 11. As a result, its layer thickness was read and found to be 234 nm, and it was seen that the layer thickness became smaller by only about 5% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 13

In 460.0 g (10 mols) of ethyl alcohol, 216.0 g (1 mol) of trifluoropropyltrimethoxysilane was added. These were well mixed, and thereafter an aqueous solution prepared by dissolving 1.6 g (0.025 mol) of nitric acid in 27.0 g (1.5 mols) of distilled water was added while continuing to stir the mixture, and the reaction was allowed to proceed at room temperature for 2 hours as it was. A solution prepared by dissolving 170.0 g (0.5 mol) of tetrabutoxytitanium in 460.0 g (10 mols) of ethyl alcohol was further added thereto, and the mixture obtained was stirred for 2 hours. Thereafter, 304.0 g (2 mols) of tetramethoxysilane and 460.0 g (10 mols) of ethanol were added thereto. These were well mixed, and then an aqueous solution prepared by dissolving 3.2 g (0.05 mol) of nitric acid in 72.0 g (4 mols) of distilled water was added. While continuing to stir the mixture, the reaction was allowed to proceed for 24 hours to produce a material for forming silica-base coated insulation films. The number average molecular weight of this insulation film forming material was calculated in the same manner as in Example 11. As a result, it was found to be about 1,520. This insulation film forming material did not gel at all even after being left to stand at room temperature for a month.

Using 1.5 ml of this material for forming silica-base coated insulation films, a transparent and uniform silica-base insulation film was formed in the same manner as in Example 11 on a silicon wafer having been mirror-polished on one side. This insulation film had a layer thickness of 259 nm. Also, using an optical microscope, the surface of this insulation film was observed, and no such as cracks or pinholes were seen.

This silica-base insulation film was subjected to oxygen plasma treatment in the same manner as in Example 11. As a result, its layer thickness was read was found to be 246 nm, and it was seen that the layer thickness became smaller by only about 5% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

COMPARATIVE EXAMPLE 3

In 920.0 g (20 mols) of ethyl alcohol, 136.0 g (1 mol) of methyltrimethoxysilane was added. These were well mixed, and thereafter an aqueous solution prepared by dissolving 1.6 g (0.025 mol) of nitric acid in 27.0 g (1.5 mols) of distilled water was added while continuing to stir the mixture, and the reaction was allowed to proceed at room temperature for 2 hours as it was. Then, 304.0 g (2 mols) of tetramethoxysilane and 460.0 g (10 mols) of ethanol were added thereto. These were well mixed, and then an aqueous solution prepared by dissolving 3.2 g (0.05 mol) of nitric acid in 72.0 g (4 mols) of distilled water was added. While continuing to stir the mixture, the reaction was allowed to proceed for 24 hours to produce a material for forming silica-base coated insulation films. The number average molecular weight of this insulation film forming material was calculated in the same manner as in Example 11. As a result, it was found to be about 780. This insulation film forming material did not gel at all even after being left to stand at room temperature for a month.

Using 1.5 ml of this material for forming silica-base coated insulation films, a transparent and uniform silica-base insulation film was formed in the same manner as in Example 11 on a silicon wafer having been mirror-polished on one side. This insulation film had a layer thickness of 259 nm. Also, using an optical microscope, the surface of this insulation film was observed, and no defects such as cracks or pinholes were seen.

This silica-base insulation film was subjected to oxygen plasma treatment in the same manner as in Example 11. As a result, its layer thickness was read and found to be 195 nm, and it was seen that the layer thickness became smaller by as much as about 24% when exposed to oxygen plasma. Using the optical microscope, the surface of this insulation film was also observed, and a great number of cracks were seen to have occurred over the whole surface.

An IR spectrum of this insulation film was also measured. As a result, no absorption peak ascribable to the alkyl group (methyl group) which had been seen after the baking at 430° C. was seen at all after the oxygen plasma treatment, and the alkyl group was found to be released because of oxygen plasma.

EXAMPLE 14

In 920.0 g (20 mols) of ethyl alcohol, 408.0 g (3 mols) of methyltrimethoxysilane was added. These were well mixed, and thereafter an aqueous solution prepared by dispersing 4.7 g (0.075 mol) of nitric acid in 81.0 g (4.5 mols) of distilled water was added while continuing to stir the mixture, and the reaction was allowed to proceed at room temperature for 2 hours as it was. A solution prepared by dissolving 170.0 g (0.5 mol) of tetrabutoxytitanium in 460.0 g (10 mols) of ethyl alcohol was further added thereto. While continuing to stir the mixture, the reaction was allowed to proceed for 24 hours to produce a material for forming silica-base coated Insulation films. With respect to this insulation film forming material, its molecular weight distribution was measured using tetrahydrofuran as an eluting solution and using an HPLC (high-speed liquid chromatography) apparatus (Model 6000, manufactured by Hitachi Ltd.). From the results of measurement, number average molecular weight in terms of polystyrene was calculated (columns used: available from Hitachi Chemical Co., Ltd.; trade name: GELPACK GL-R420; flow rate: 1.75 ml/min.). As a result, it was found to be about 1,550. This insulation film forming material did not gel at all even after being left to stand at room temperature for a month.

Using 1.5 ml of this material for forming silica-base coated insulation films, a silicon wafer having been mirror-polished on one side was coated with this material on Its surface by means of a spin coater at 2,000 rpm for 20 seconds, followed by drying for 30 seconds on a 150° C. hot plate and for 30 seconds on a 250° C. hot plate to remove the solvent. Subsequently, using a tubular baking furnace and in an atmosphere of nitrogen, the coating for ed was heated at 430° C. for 30 minutes to cure, to thereby obtain a transparent and uniform silica-base insulation film. Using an optical interference layer thickness meter (trade name: LAMBDA ACE; manufactured by Dainippon Screen Mfg. Co., Ltd.), the thickness of this insulation film was measured, and it was found to be 305 nm. Also, using an optical microscope, the surface of this insulation film was observed, and no defects such as cracks or pinholes were seen.

This silica-base insulation film was subjected to oxygen plasma treatment using a barrel type isotropic plasma etching apparatus and under conditions of oxygen: 1 Torr, output: 400 W, time: 20 minutes. Thereafter, the thickness of the film thus treated was measured to reveal that it was 292 nm, and it was seen that its layer thickness became smaller by only about 4% even when exposed to oxygen plasma. Also, using an optical microscope, the surface of this insulation film was observed, where no defects such as cracks or pinholes were seen.

An IR spectrum of this insulation film was also measured. As a result, an absorption peak ascribable to the alkyl group (methyl group) was seen also after the oxygen plasma treatment, and the film was found to have a good oxygen plasma resistance.

EXAMPLE 15

In 920.0 g (20 mols) of ethyl alcohol, 408.0 g (3 mols) of methyltrimethoxysilane was added. These were well mixed, and thereafter an aqueous solution prepared by dissolving 4.7 g (0.075 mol) of nitric acid in 81.0 g (4.5 mols) of distilled water was added while continuing to stir the mixture, and the reaction was allowed to proceed at room temperature for 2 hours as it was. A solution prepared by dissolving 182.0 g (0.5 mol) of titanium dipropoxybisacetylacetonate in 460.0 g (10 mols) of ethyl alcohol was further added thereto. While continuing to stir the mixture, the reaction was allowed to proceed for 24 hours to produce a material for forming silica-base coated insulation films. The number average molecular weight of this insulation film forming material was calculated in the same manner as in Example 14. As a result, it was about 1,520. This insulation film forming material did not gel at all even after being left to stand at room temperature for a month.

Using 1.5 ml of this material for forming silica-base coated insulation films, a transparent and uniform silica-base insulation film was formed in the same manner as in Example 14 on a silicon wafer having been mirror-polished on one side. This insulation film had a layer thickness of 292 nm. Also, using an optical microscope, the surface of this insulation film was observed, and no defects such as cracks or pinholes were seen.

This silica-base insulation film was subjected to oxygen plasma treatment in the same manner as in Example 14. As a result, its layer thickness was read and found to be 281 nm, and it was seen that the layer thickness became smaller by only about 4% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (methyl group) was also seen after the oxygen plasma treatment, and the film was found to have a good oxygen plasma resistance.

EXAMPLE 16

In 920.0 g (20 mols) of ethyl alcohol, 648.0 g (3 mol) of trifluoropropyltrimethoxysilane was added. These were well mixed, and thereafter an aqueous solution prepared by dissolving 4.7 g (0.075 mol) of nitric acid in 81.0 g (4.5 mols) of distilled water was added while continuing to stir the mixture, and the reaction was allowed to proceed at room temperature for 2 hours as it was. A solution prepared by dissolving 170.0 g (0.5 mol) of tetrabutoxytitanium in 460.0 g (10 mols) of ethyl alcohol was further added thereto. While continuing to stir the mixture, the reaction was allowed to proceed for 24 hours to produce a material for forming silica-base coated insulation films. The number average molecular weight of this insulation film forming material was calculated in the same manner as in Example 14. As a result, it was found to be about 1,230. This insulation film forming material did not gel at all even after left to stand at room temperature for a month.

Using 1.5 ml of this material for forming silica-base coated insulation films, a transparent and uniform silica-base insulation film was formed in the same manner as in Example 14 on a silicon wafer having been mirror-polished on one side. This insulation film had a layer thickness of 303 nm. Also, using an optical microscope, the surface of this insulation film was observed, and no defects such as cracks or pinholes were seen.

This silica-base insulation film was subjected to oxygen plasma treatment in the same manner as in Example 14. As a result, its layer thickness was read to be 292 nm, and it was seen that the layer thickness became smaller by only about 4% even when exposed to oxygen plasma. Using the optical microscope, the surface of this insulation film was also observed, and no defects such as cracks or pinholes were seen.

An IR spectrum of this insulation film was also measured. As a result, an absorption peak ascribable to the alkyl group (trifluoropropyl group) was also seen after the oxygen plasma treatment, and the film was found to have a good oxygen plasma resistance.

COMPARATIVE EXAMPLE 4

In 920.0 g (20 mols) of ethyl alcohol, 136.0 g (1 mol) of methyltrimethoxysilane was added. These were well mixed, and thereafter an aqueous solution prepared by dissolving 1.6 g (0.025 mol) of nitric acid in 27.0 g (1.5 mols) of distilled water was added while continuing to stir the mixture, and the reaction was. allowed to proceed at room temperature for 24 hours as it was, to produce a material for forming silica-base coated insulation films. With respect to this insulation film forming material, the number average molecular weight was calculated in the same manner as in Example 14. As a result, it was found to be about 880. This insulation film forming material did not gel at all even after being left to stand at room temperature for a month.

Using 1.5 ml of this material for forming silica-base coated insulation films, a transparent and uniform silica-base insulation film was formed in the same manner as in Example 14 on a silicon wafer having been mirror-polished on one side. This insulation film had a layer thickness of 206 nm. Also, using an optical microscope, the surface of this insulation film was observed, and no defects such as cracks or pinholes were seen.

This silica-base insulation film was subjected to oxygen plasma treatment in the same manner as in Example 14. As a result, its layer thickness was read and found to be 129 nm, and it was seen that the layer thickness became smaller by as much as about 37% when exposed to oxygen plasma. Using the optical microscope, the surface of this insulation film was also observed, and a great number of cracks were seen to have occurred over the whole surface.

An IR spectrum of this insulation film was also measured. As a result, any absorption peak ascribable to the alkyl group (methyl group) which had been seen after the baking at 430° C. was not seen at all after the oxygen plasma treatment, and the alkyl group was found to be released because of oxygen plasma.

EXAMPLE 17

In 345 g (7.5 mols) of ethyl alcohol, 152 g (1 mol) of tetramethoxysilane and 136 g (1 mol) of methyltrimethoxysilane were added. These were well mixed, and thereafter a solution prepared by dissolving 42.5 g (0.125 mol) of tetrabutoxytitanium in 230 g (5 mols) of ethyl alcohol was added while continuing to stir the mixture. While further continuing to stir the mixture, the reaction was allowed to proceed for 24 hours, and thereafter, 16.5 g (0.04 mol) of triphenylsulfonium trifluoromethanesulfonate was added and completely dissolved to produce a material for forming silica-base coated thin films. With respect to this insulation film forming material, its molecular weight distribution was measured using tetrahydrofuran as an eluting solution and using an HPLC (high-speed liquid chromatography) apparatus (Model 6000, manufactured by Hitachi Ltd.). From the results of measurement, number average molecular weight in terms of polystyrene was calculated (columns used: available from Hitachi Chemical Co., Ltd.; trade name: GELPACK GL-R420; flow rate: 1.75 ml/min.). As a result, it was found to be about 3,260. This thin-film forming material did not gel at all even after being left to stand at room temperature for a month.

Using 1.5 ml of this material for forming silica-base coated thin films, a silicon wafer having been mirror-polished on one side was coated with this material on its surface by means of a spin coater at 3,000 rpm for 30 seconds, followed by drying for 1 minute on an 80° C. hot plate to remove the solvent. On this silicon wafer, a metal mask (a stainless steel sheet from which a stripe pattern was punched) was placed and irradiated by light (maximum wavelength: 254 nm) of a low-pressure mercury lamp for 10 minutes, followed by heat-curing on a 120° C. hot plate for 2 minutes. The cured product obtained was developed in a methyl isobutyl ketone solution for 2 minutes, followed by washing with cyclohexane, whereby a silica-base thin film having a pattern corresponding to the metal mask pattern was formed on the silicon wafer. Using an optical microscope, the surface of this thin film was observed, and no defects such as cracks or pinholes were seen.

EXAMPLE 18

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then a solution prepared by dissolving 42.5 g (0.125 mol) of tetrabutoxytitanium in 230 g (5 mols) of ethyl alcohol was added. While further continuing to stir the mixture, the reaction was allowed to proceed for 24 hours, and thereafter 16.5 g (0.04 mol) of triphenylsulfonium trifluoromethanesulfonate was added and completely dissolved to produce a material for forming silica-base coated thin films. With respect to this thin film forming material, its number average molecular weight was calculated in the same manner as in Example 17. As a result, it was found to be about 3,190. This thin-film forming material did not gel at all even after being left to stand at room temperature for a month.

Using 1.5 ml of this material for forming silica-base coated thin films, a patterned silica-base thin film was obtained in the same manner as in Example 17 on a silicon wafer having been mirror-polished on one side. Using an optical microscope, the surface of this thin film was observed, and no defects such as cracks or pinholes were seen.

EXAMPLE 19

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 136 g (1 mol) of methyltrimethoxysilane. The mixture obtained was well mixed, and then a solution prepared by dissolving 45.5 g (0.125 mol) of titanium dipropoxybisacetylacetonate in 230 g (5 mols) of ethyl alcohol was added. While further continuing to stir the mixture, the reaction was allowed to proceed for 24 hours, and thereafter 16.5 g (0.04 mol) of triphenylsulfonium trifluoromethanesulfonate was added and completely dissolved to produce a material for forming silica-base coated thin films. With respect to this thin film forming material, its number average molecular weight was calculated in the same manner as in Example 17. As a result, it was found to be about 1,180. This thin-film forming material did not gel at all even after being left to stand at room temperature for a month.

Figure 3:
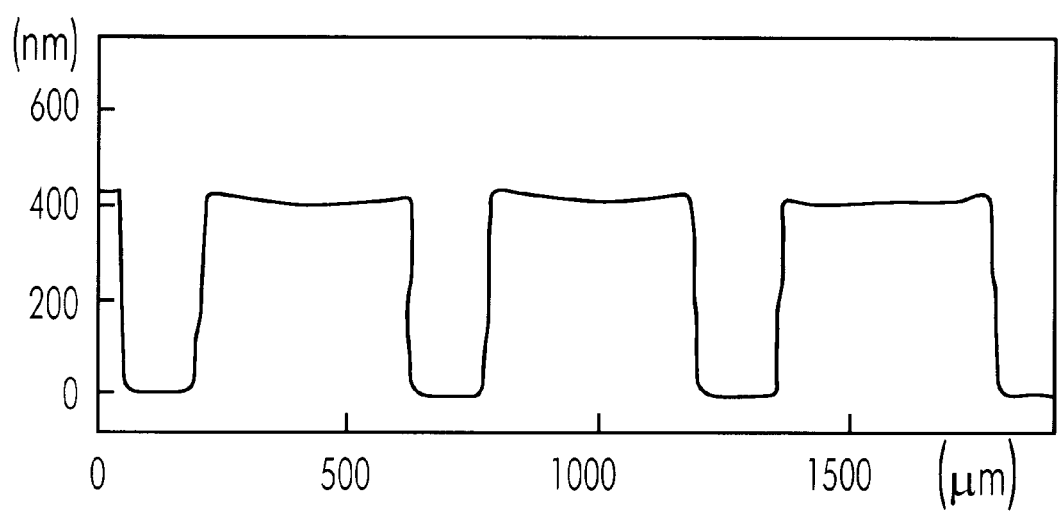
FIG. 3 illustrates, in a graph, the result of the measurement on surface roughness of the patterned silica-base thin film formed in example 19.

Using 1.5 ml of this material for forming silica-base coated thin films, a patterned silica-base thin film was obtained in the same manner as in Example 17 on a silicon wafer having been mirror-polished on one side. Using an optical microscope, the surface of this thin film was observed, and no defects such as cracks or pinholes were seen. FIG. 3 shows the results of measurement on surface roughness of this silica-base thin film, measured by means of a contact type surface profile analyzer. As is seen from these results, the silica-base thin film obtained had a layer thickness of about 400 nm and a pattern corresponding to the metal mask pattern was formed on the surface.

EXAMPLE 20

In 345 g (7.5 mols) of ethyl alcohol, 152 g (1 mol) of tetramethoxysilane was added. These were well mixed, and thereafter an aqueous solution prepared by dissolving 2.45 g (0.025 mol) of maleic anhydride in 72 g (4 mols) of distilled water was added while continuing to stir the mixture, and the temperature was raised to 60° C. While maintaining the temperature at 60° C., the mixture was heated for 1 hour, and thereafter cooled to room temperature, followed by addition of 109 g (0.5 mol) of trifluoropropyltrimethoxysilane. The mixture obtained was well mixed, and then a solution prepared by dissolving 54.5 g (0.125 mol) of titanium dipropoxybisacetylacetonate in 230 g (5 mols) of ethyl alcohol was added. While further continuing to stir the mixture, the reaction was allowed to proceed for 24 hours, and thereafter 16.5 g (0.04 mol) of triphenylsulfonium trifluoromethanesulfonate was added and completely dissolved to produce a material for forming silica-base coated thin films. With respect to this thin film forming material, its number average molecular weight was calculated in the same manner as in Example 17. As a result, it was found to be about 1,650. This thin-film forming material did not gel at all even after being left to stand at room temperature for a month.

Using 1.5 ml of this material for forming silica-base coated thin films, a patterned silica-base thin film was obtained in the same manner as in Example 17 on a silicon wafer having been mirror-polished on one side. Using an optical microscope, the surface of this thin film was observed, and no defects such as cracks or pinholes were seen.

COMPARATIVE EXAMPLE 5

In 575 g (12.5 mols) of ethyl alcohol, 152 g (1 mol) of tetramethoxysilane and 136 g (1 mol) of methyltrimethoxysilane were added. These were well mixed, and thereafter an aqueous solution prepared by dissolving 4.9 g (0.05 mol) of maleic anhydride in 126 g (7 mols) of distilled water was added while continuing to stir the mixture. While further continuing to stir the mixture, the reaction was allowed to proceed for 24 hours to produce a material for forming silica-base coated thin films. With respect to this insulation film forming material, its number average molecular weight was calculated in the same manner as in Example 17. As a result, it was found to be about 780. This thin-film forming material, being left to stand at room temperature, caused a gradual increase in molecular weight, and a precipitate began to occur in about a month.

Using 1.5 ml of this material for forming silica-base coated thin films, a silica-base thin film was formed in the same manner as in Example 17 on a silicon wafer having been mirror-polished on one side. Using an optical microscope, the surface of this thin film was observed, and no such as cracks or pinholes were seen, but no pattern corresponding to the metal mask pattern was not seen at all. From the results of measurement on surface roughness by means of the surface profile analyzer, no hills or valleys corresponding to the metal mask pattern were seen at all.

The materials for forming silica-base coated insulation films according to the first to fifth invention of the present application have storage stability and also enable thick-layer formation with ease by spin coating etc. Silica-base insulation films produced using this material for forming silica-base coated insulation films are transparent and uniform films and are those in which no defects such as cracks or pinholes are seen. Moreover, when this insulation film is subjected to oxygen plasma treatment, its layer thickness does not become much smaller, and not only do no defects such as cracks or pinholes occur on its surface but also not so much change is seen in the constituents of films. Thus, a superior oxygen plasma resistance is seen.

The material for forming silica-base coated thin films according to the sixth invention of the present application has a storage stability and also enables thick-layer formation with ease by spin coating etc. Silica-base thin films produced using this material for forming silica-base coated thin films are transparent and uniform films and are those in which none of defects such as cracks or pinholes are seen. Moreover, when thin films are produced, they can be formed into a pattern by exposure to light.

I claim:

1. A process for producing the material for forming a silica-base coated insulation film comprising
   (a) an alkoxysilane, a partially hydrolyzed alkoxysilane or mixtures thereof;
   (b) a fluorine-containing alkoxysilane;
   (c) at least one of an alkoxide of Ti, an alkoxide of Zr and derivatives thereof; and
   (d) an organic solvent,
   wherein a total amount of said component (a) and said component (b) is 1–40 parts by weight based on 100 parts by weight of said organic solvent (d), and said process comprising mixing an alkoxysilane and a fluorine-containing alkoxysilane in an organic solvent, followed by addition of at least one of an alkoxide of Ti, an alkoxide of Zr and derivatives thereof.

2. A process for producing the material for forming a silica-base coated insulation film comprising
   (a) an alkoxysilane, a partially hydrolyzed alkoxysilane or mixtures thereof;
   (b) a fluorine-containing alkoxysilane;
   (c) at least one of an alkoxide of Ti, an alkoxide of Zr and derivatives thereof; and
   (d) an organic solvent,
   wherein a total amount of said component (a) and said component (b) is 1–40 parts by weight based on 100 parts by weight of said organic solvent (d), and said process comprising synthesizing a partially hydrolyzed product of an alkoxysilane in an organic solvent, and mixing a fluorine-containing alkoxysilane in the product, followed by addition of at least one of an alkoxide of Ti, an alkoxide of Zr and derivatives thereof.

3. A process for producing the material for forming a silica-base coated insulation film comprising:
   (a) an alkoxysilane, a partially hydrolyzed alkoxysilane or mixtures thereof;
   (b) an alkylalkoxysilane;
   (c) at least one of an alkoxide of Ti, an alkoxide of Zr and derivatives thereof; and
   (d) an organic solvent,
   wherein a total amount of said component (a) and said component (b) is 1–40 parts by weight based on 100 parts by weight of said organic solvent (d), and said process comprising mixing an alkoxysilane and an alkylalkoxysilane in an organic solvent, followed by addition of at least one of an alkoxide of Ti, an alkoxide of Zr and derivatives thereof.

4. A process for producing the material for forming a silica-base coated insulation film comprising:
   (a) an alkoxysilane, a partially hydrolyzed alkoxysilane or mixtures thereof;
   (b) an alkylalkoxysilane;
   (c) at least one of an alkoxide of Ti, an alkoxide of Zr and derivatives thereof; and
   (d) an organic solvent,
   wherein a total amount of said component (a) and said component (b) is 1–40 parts by weight based on 100 parts by weight of said organic solvent (d), and said process comprising synthesizing a partially hydrolyzed product of an alkoxysilane in an organic solvent, and mixing an alkylalkoxysilane in the product, followed by addition of at least one of an alkoxide of Ti, an alkoxide of Zr and derivatives thereof.

5. A process for producing a material for forming a silica-base coated insulation film comprising:

(a) an alkoxysilane;

(b) an alkylalkoxysilane, a fluorine-containing alkoxysilane, or mixtures thereof;

(c) at least one of an alkoxide of Ti, an alkoxide of Zr and derivatives thereof;

(d) an organic solvent; and (e) water and a catalyst;

said process comprising mixing the alkylalkoxysilane, the fluorine-containing alkoxysilane or mixtures thereof, the water, and the catalyst in an organic solvent, thereafter adding at least one of the alkoxide of Ti, the alkoxide of Zr and derivatives thereof, the alkoxysilane, and thereafter adding the water and the catalyst.

6. A process for producing the material for forming a silica-base coated insulation film comprising:

(a) an alkylalkoxysilane, a fluorine-containing alkoxysilane or mixtures thereof;

(b) at least one of an alkoxide of Ti, an alkoxide of Zr and derivatives thereof;

(c) an organic solvent; and (d) water and a catalyst, wherein a total amount of said alkylalkoxysilane and said fluorine-containing alkoxysilane is 1–40 parts by weight based on 100 parts by weight of said organic solvent, and said process comprising mixing an alkylalkoxysilane, a fluorine-containing alkoxysilane, or mixtures thereof and water and a catalyst in an organic solvent, followed by addition of at least one of an alkoxide of Ti, an alkoxide of Zr and derivatives thereof.

7. A process for producing the material for forming a silica-base coated insulation film comprising:

(a) an alkoxysilane, a partially hydrolyzed alkoxysilane, or mixtures thereof;

(b) an alkylalkoxysilane, a fluorine-containing alkoxysilane or mixtures thereof;

(c) at least one of an alkoxide of Ti, an alkoxide of Zr and derivatives thereof;

(d) an organic solvent; and (g) a photo-acid generator, wherein a total amount of said alkoxysilane and said alkylalkoxysilane and/or said fluorine-containing alkoxysilane is 1–40 parts by weight based on 100 parts by weight of said organic solvent, and said process comprising mixing an alkoxysilane and an alkylalkoxysilane, a fluorine-containing alkoxysilane or mixtures thereof, followed by addition of at least one of an alkoxide of Ti, an alkoxide of Zr and derivatives thereof, and further followed by addition of a photo-acid-generator.

8. A process for producing the material for forming a silica-base coated insulating film comprising:

(a) an alkoxysilane, a partially hydrolyzed alkoxysilane, or mixtures thereof;

(b) an alkylalkoxysilane, a fluorine-containing alkoxysilane or mixtures thereof;

(c) at least one of an alkoxide of Ti, an alkoxide of Zr and derivatives thereof;

(d) an organic solvent; and (g) a photo-acid generator, wherein a total amount of said alkoxysilane and said alkylalkoxysilane and/or said fluorine-containing alkoxysilane is 1–40 parts by weight based on 100 parts by weight of said organic solvent, and said process comprising synthesizing a partially hydrolyzed product of an alkoxysilane in an organic solvent, and mixing an alkylalkoxysilane, a fluorine-containing alkoxysilane or mixtures thereof in the product, followed by addition of at least one of an alkoxide of Ti, an alkoxide of Zr and derivatives thereof, and further followed by addition of a photo-acid-generator.

\* \* \* \* \*